(12) United States Patent
Xia et al.

(10) Patent No.: US 11,830,887 B2
(45) Date of Patent: Nov. 28, 2023

(54) ARRAY SUBSTRATE, MANUFACTURING METHOD OF THE ARRAY SUBSTRATE, AND DISPLAY PANEL

(71) Applicants: Chuzhou HKC Optoelectronics Technology Co., Ltd., Chuzhou (CN); HKC Corporation Limited, Shenzhen (CN)

(72) Inventors: Yuming Xia, Chuzhou (CN); Lidan Ye, Chuzhou (CN)

(73) Assignees: Chuzhou HKC Optoelectronics Technology Co., Ltd., Chuzhou (CN); HKC Corporation Limited, Shenzhen (CN)

( * ) Notice: Subject to any disclaimer, the term of this patent is extended or adjusted under 35 U.S.C. 154(b) by 200 days.

(21) Appl. No.: 17/343,772

(22) Filed: Jun. 10, 2021

(65) Prior Publication Data

US 2022/0037379 A1 Feb. 3, 2022

(30) Foreign Application Priority Data

Jul. 29, 2020 (CN) .......................... 202010741292.X

(51) Int. Cl.
*H01L 27/12* (2006.01)
*C23C 18/16* (2006.01)
(Continued)

(52) U.S. Cl.
CPC ...... *H01L 27/1292* (2013.01); *C23C 18/1608* (2013.01); *C23C 18/1689* (2013.01);
(Continued)

(58) Field of Classification Search
CPC .......................... H01L 21/288; C23C 18/1608
See application file for complete search history.

(56) References Cited

U.S. PATENT DOCUMENTS

| 2003/0060040 A1* | 3/2003 | Lee ........................ H01L 21/288 438/650 |
| 2008/0206530 A1 | 8/2008 | Song et al. |

(Continued)

FOREIGN PATENT DOCUMENTS

| CN | 101000873 A | 7/2007 |
| CN | 103151424 A | 6/2013 |
| CN | 103299429 A | 9/2013 |

*Primary Examiner* — Paisley L Wilson

(57) ABSTRACT

The present application discloses a array substrate, a manufacturing method of the array substrate, and a display panel, the manufacture procedure includes the following steps: sequentially forming a buffer layer and a photoresist layer on a glass substrate; placing the substrate into an activation agent for activation, and forming an activation liquid particle layer with a first preset pattern at a corresponding position where the activation agent is in contact with the photoresist layer, and forming an activation liquid particle layer with a second preset pattern at a corresponding position where the activation agent is in contact with the buffer layer; removing the photoresist layer and the activation liquid particle layer with the first preset pattern; and performing chemical plating to form a first metal layer at a position corresponding to the activation liquid particle layer with the second preset pattern in contact with the buffer layer.

18 Claims, 6 Drawing Sheets

(51) Int. Cl.
  *H01L 29/786* (2006.01)
  *G02F 1/1368* (2006.01)
  *C23C 18/40* (2006.01)
  *H01L 21/288* (2006.01)
  *G03F 7/00* (2006.01)
  *G02F 1/1362* (2006.01)

(52) U.S. Cl.
  CPC ............ *C23C 18/40* (2013.01); *G02F 1/1368* (2013.01); *H01L 21/288* (2013.01); *H01L 27/124* (2013.01); *H01L 27/1218* (2013.01); *H01L 27/1262* (2013.01); *H01L 27/1288* (2013.01); *H01L 29/78606* (2013.01); *G02F 1/13629* (2021.01); *G02F 1/136295* (2021.01); *G02F 2201/07* (2013.01); *G03F 7/0007* (2013.01)

(56) References Cited

U.S. PATENT DOCUMENTS

2013/0299450 A1\* 11/2013 Song ................. H05K 3/24
  216/13
2014/0014950 A1\* 1/2014 Hara ................. G02F 1/136286
  257/43

\* cited by examiner

ARRAY SUBSTRATE, MANUFACTURING METHOD OF THE ARRAY SUBSTRATE, AND DISPLAY PANEL

The present application claims priority to the Chinese Patent Application No. CN202010741292.X, filed Jul. 29, 2020, which is hereby incorporated by reference herein as if set forth in its entirety.

TECHNICAL FIELD

The present application relates to the field of display technologies, particularly to a array substrate, a manufacturing method of the array substrate, and a display panel.

BACKGROUND

The statements herein merely provide background information related to the present application and do not necessarily constitute the conventional art.

A display panel includes a Thin Film Transistor (TFT) including a gate electrode, a source electrode, and a drain electrode which are made of metal, and generally, a combination of Al (aluminum), Al/Mo (aluminum/molybdenum), Al/Ti (aluminum/titanium), etc. However, as the requirements for the display panel become increasingly higher, Al has difficulty in satisfying a demand for fast electronic transport due to its low conductivity, and a Cu (copper) process has become a development trend and a process demand of a next-generation TFT due to many advantages.

A copper metal layer is generally manufactured by electroplating, which involves formation of an electrode pattern on a substrate as a buffer layer and subsequent plating of copper metal on the buffer layer by electroplating. The electroplating process employed in this method features high pollution, and the treatment of the electroplate liquid involved is an important environmental issue, therefore it is difficult to popularize in a large scale at present.

SUMMARY

The present application aims to provide a array substrate, a manufacturing method of the array substrate, and a display panel which are energy-saving and environmentally friendly, and can solve the problems of high pollution and high energy consumption of electroplating.

The present application discloses a manufacturing method for a array substrate, which includes the following steps:
  forming a buffer layer on a glass substrate;
  forming a photoresist layer with a first preset pattern on the buffer layer;
  placing the glass substrate provided with the photoresist layer with the first preset pattern into an activation agent for activation, and forming an activating particle layer with the first preset pattern at a corresponding position where the activation agent is in contact with the photoresist layer with the first preset pattern, and forming an activating particle layer with a second preset pattern at a corresponding position where the activation agent is in contact with the buffer layer;
  removing the photoresist layer with the first preset pattern and the activating particle layer with the first preset pattern;
  performing chemical plating to form a first metal layer with the second preset pattern at a position corresponding to the activating particle layer with the second preset pattern; and
  sequentially forming an insulating layer, an active layer, a second metal layer, a passivation layer and a transparent electrode layer on the first metal layer.

The present application further discloses a array substrate, which includes a glass substrate, a buffer layer, a gate electrode, an insulating layer, an active layer, a source electrode, a drain electrode, a passivation layer and a transparent electrode layer, where the buffer layer is disposed on the glass substrate, the gate electrode is disposed on the buffer layer, the insulating layer covers the gate electrode, the active layer is disposed on the insulating layer, the source electrode and the drain electrode are disposed respectively on two sides of the active layer, the passivation layer and the transparent electrode layer are sequentially formed on the source electrode and the drain electrode, and the buffer layer includes a molybdenum buffer layer or a molybdenum alloy buffer layer.

The present application further discloses a display panel, which includes an array substrate and a color filter substrate disposed opposite to the array substrate. The array substrate includes a glass substrate, a buffer layer, a gate electrode, an insulating layer, an active layer, a source electrode, a drain electrode, a passivation layer and a transparent electrode layer, where the buffer layer is disposed on the glass substrate, the gate electrode is disposed on the buffer layer, the insulating layer covers the gate electrode, the active layer is disposed on the insulating layer, the source electrode and the drain electrode are disposed respectively on two sides of the active layer, the passivation layer and the transparent electrode layer are sequentially formed on the source electrode and the drain electrode, and the buffer layer includes a molybdenum buffer layer or a molybdenum alloy buffer layer.

Compared with the solution that involves the formation of an electrode pattern on a glass substrate as a buffer layer and subsequent plating of copper metal on the buffer layer by electroplating, in the present solution, an activating particle layer with a second preset pattern is formed on the buffer layer in advance through a photoresist layer and activation, and then in the chemical plating, a first metal layer corresponding to the activating particle layer with the second preset pattern is formed. Because the first metal layer used is formed through chemical plating, which is based on the principle of redox reaction and does not require electrification, the process is energy-saving and environmentally friendly, solves the problems of high pollution and high energy consumption of electroplating, and does not involve an etching process.

BRIEF DESCRIPTION OF DRAWINGS

The accompanying drawings, which are included to provide a further understanding of embodiments of the present application and constitute a part of the specification, illustrate embodiments of the present application and, together with the text description, explain the principles of the present application. Obviously, the drawings in the following description are merely some embodiments of the present application, and those skilled in the art can obtain other drawings according to the drawings without any inventive labor. In the drawings.

DETAILED DESCRIPTION OF EMBODIMENTS

It should be understood that the terms and specific structures and functional details disclosed are merely exemplary for the purpose of describing specific embodiments. However, the present application may be embodied in many alternative forms and should not be construed as being limited to the embodiments set forth herein.

In the description of the present application, the terms "first" and "second" are only for the purpose of description and cannot be construed to indicate relative importance or imply an indication of the number of technical features indicated. Therefore, unless otherwise stated, a feature defined as "first" and "second" may explicitly or implicitly include one or more of the features; "multiple" means two or more. The term "include" and any variations thereof are intended to be inclusive in a non-closed manner, that is, the presence or addition of one or more other features, integers, steps, operations, units, components and/or combinations thereof may be possible.

In addition, the terms "center", "horizontally", "up", "down", "left" "right", "vertical", "horizontal", "top", "bottom", "inner", "outer" and the like for indicating an orientation or positional relationship are based on the description of the orientation or relative positional relationship shown in the accompanying drawings, and are only simplified description facilitating description of the application, and are not intended to indicate that the device or element referred to must have a particular orientation or be configured and operated in a particular orientation, and therefore cannot be construed as limiting the present application.

In addition, unless expressly specified and defined otherwise, the terms "mount", "attach" and "connect" are to be understood broadly. For example, it can be a fixed connection, a detachable connection, or an integral connection; it can be either a mechanical connection or an electrical connection; it can be a direct connection or an indirect connection through an intermediate medium, or an internal connection between two elements. For those skilled in the art, the specific meaning of the above terms in the present application can be understood according to the specific circumstances.

A copper (Cu) metal layer is manufactured by electroplating, which involves formation of an electrode pattern on a glass substrate as a buffer layer and subsequent plating of copper metal on the buffer layer by electroplating. This method does not involve an etching process of Cu and thus solves the problem of poor effect of Cu etching. However, the electroplating process employed in this method features high pollution, and the treatment of the electroplate liquid involved is an important environmental issue, therefore it is difficult to popularize in a large scale at present.

The present application will now be described in details by reference to the accompanying drawings and optional embodiments.

Figure 1:
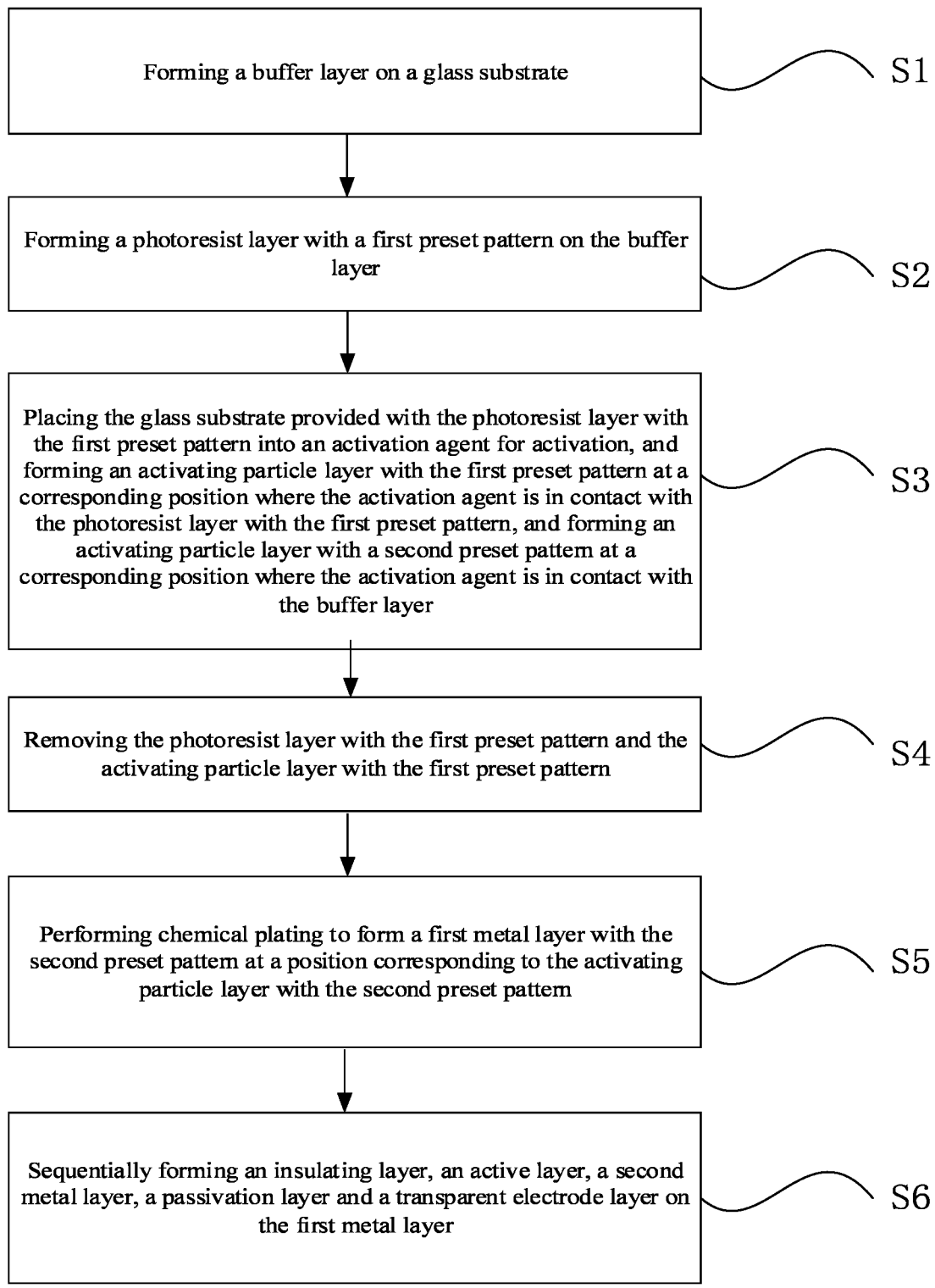
FIG. 1 is a schematic flowchart of a manufacturing method for a array substrate according to an embodiment of the present application.

FIG. 1 is a schematic flowchart of a manufacturing method for a array substrate according to an embodiment of the present application. As shown in FIG. 1, the present application discloses a manufacturing method for a array substrate, which includes:

S1: forming a buffer layer on a glass substrate;

S2: forming a photoresist layer with a first preset pattern on the buffer layer;

S3: placing the glass substrate provided with the photoresist layer with the first preset pattern into an activation agent for activation, and forming an activating particle layer with the first preset pattern at a corresponding position where the activation agent is in contact with the photoresist layer with the first preset pattern, and forming an activating particle layer with a second preset pattern at a corresponding position where the activation agent is in contact with the buffer layer;

S4: removing the photoresist layer with the first preset pattern and the activating particle layer with the first preset pattern;

S5: performing chemical plating to form a first metal layer with the second preset pattern at a position corresponding to the activating particle layer with the second preset pattern; and S6: sequentially forming an insulating layer, an active layer, a second metal layer, a passivation layer and a transparent electrode layer on the first metal layer.

With respect to the solution that manufactures the first metal layer (such as a copper metal layer) by electroplating, what's involved is formation of an electrode pattern on a glass substrate as a buffer layer and subsequent plating of metal on the buffer layer by electroplating. The electroplating process employed in this method features high pollution, and therefore it is difficult to popularize in a large scale at present. In the present solution, an activating particle layer with a second preset pattern is formed on the buffer layer in advance through a photoresist layer and activation, and in the chemical plating, a first metal layer corresponding to the activating particle layer with the second preset pattern is formed through chemical reaction. Because the first metal layer used is formed through chemical plating, which is based on the principle of redox reaction and does not require electrification, the process is energy-saving and environmentally friendly, solves the problems of high pollution and high energy consumption of electroplating, and does not involve an etching process.

The technical principle of chemical plating is as follows: chemical plating is a method characterized by reducing metal ions into metal in a solution containing the metal ions using a strong reducing agent (such as palladium particles, sodium hypophosphite and the like) in accordance with the principle of redox reaction and depositing the metal on the surface of various materials to form a compact clad layer, and it does not require electrification.

Specifically, when a Thin Film Transistor (TFT) formed on the array substrate is a bottom-gate structure, the first metal layer includes a gate electrode and a scan line formed in the same layer by chemical plating. The TFT may also be a top-gate structure, and chemical plating method is also applicable to form the gate electrode.

In addition, when the buffer layer is made of transparent and non-conductive material, it may not be etched. For example, when the TFT is disposed on a color resist layer, the buffer layer is the color resist layer, and when the buffer layer is a metal layer, it is necessary to etch away the corresponding, transparent region of the buffer layer.

Specifically, the step S5 of performing chemical plating to form a first metal layer with the second preset pattern at a position corresponding to the activating particle layer with the second preset pattern is followed by:

etching away a part of the buffer layer uncovered by the first metal layer with the second preset pattern to form a buffer layer with the second preset pattern;

where the buffer layer includes a molybdenum buffer layer or a molybdenum alloy buffer layer.

The formed buffer layer includes a molybdenum buffer layer or a molybdenum alloy buffer layer, which is beneficial to improving the adhesive force. The buffer layer may also include Ti (titanium)/MoN (molybdenum nitride), etc. After the first metal layer with the second preset pattern is formed by chemical plating, a part of the buffer layer uncovered by the first metal layer with the second preset pattern is etched away by dry etching, so as to prevent the residual molybdenum buffer layer or molybdenum alloy buffer layer from affecting other structural layers.

In the present application, the activation agent is used to form an activating particle layer with a second preset pattern, and the activating particle layer with the second preset pattern is used as a catalyst in chemical plating to form a first metal layer with the second preset pattern. Specifically, in the step S3 of placing the glass substrate provided with the photoresist layer with the first preset pattern into an activation agent for activation, and forming an activating particle layer with the first preset pattern at a corresponding position where the activation agent is in contact with the photoresist layer with the first preset pattern and forming an activating particle layer with a second preset pattern at a corresponding position where the activation agent is in contact with the buffer layer, the activation agent is an activation liquid, the activation is soaking activation, the activating particle layer is an activation liquid particle layer, the temperature of the activation liquid is 10-30° C., and the soaking time of the soaking activation is 10-100 seconds. The activating particle layer can be formed by Physical Vapor Deposition (PVD) and magnetron sputtering in addition to by an activation liquid.

The glass substrate provided with the photoresist layer with the first preset pattern is placed into an activation liquid for soaking activation, which results in the deposition of an activation liquid particle layer on the surface in contact with the buffer layer, and the formed activation liquid particle layer is favorable for chemical plating. Specifically, soaking activation is to soak the glass substrate in the activation agent at normal temperature for about 10-100 seconds, and turned over in the midway to uniformly activate the whole glass substrate. Washing is not needed. The activation agent and the activation liquid particle layer include the following components: HCl (hydrogen chloride)+$SnCl_2$ (stannous chloride)+$PdCl_2$ (palladium chloride), or HCl (hydrogen chloride)+NaCl (sodium chloride)+$SnCl_2$ (stannous chloride)+$PdCl_2$ (palladium chloride), or HCl (hydrogen chloride)+KCl (potassium chloride)+$SnCl_2$ (stannous chloride)+$PdCl_2$ (palladium chloride), or the like, where the activation liquid particle layer is formed by depositing an activation liquid at a certain temperature (generally within a range of 10-30° C.).

The temperature of the activation liquid is controlled within the range of 10-30° C., and the soaking time of the soaking activation is 10-100 seconds, so that the adhesive force can be improved. If the temperature of the activation liquid is too high, the deposition rate of metal deposition is high, and the soaking activation is not uniform. In addition, the soaking activation is performed at a normal temperature environment, the reaction environment is easy to realize, the requirement for process is low, and thus the cost is favorably reduced. Besides, damage to the glass substrate due to high or low temperature is prevented, thereby protecting the integrity of the glass substrate.

As for chemical plating, copper plating may be performed, and a copper metal layer with a second preset pattern is formed as the first metal layer at a position corresponding to the activating particle layer with the second preset pattern. The plated metal is copper metal, and the formed copper metal layer is compact and has good binding force. In addition, the formed copper metal layer has good conductivity compared with metal layers formed by other metals, so that the signal delay time is reduced, the refresh rate is improved, and the charging time is shortened. Chemical nickel plating may also be performed, and a nickel metal layer with a second preset pattern is formed as the first metal layer at a position corresponding to the activating particle layer with the second preset pattern.

Figure 2:
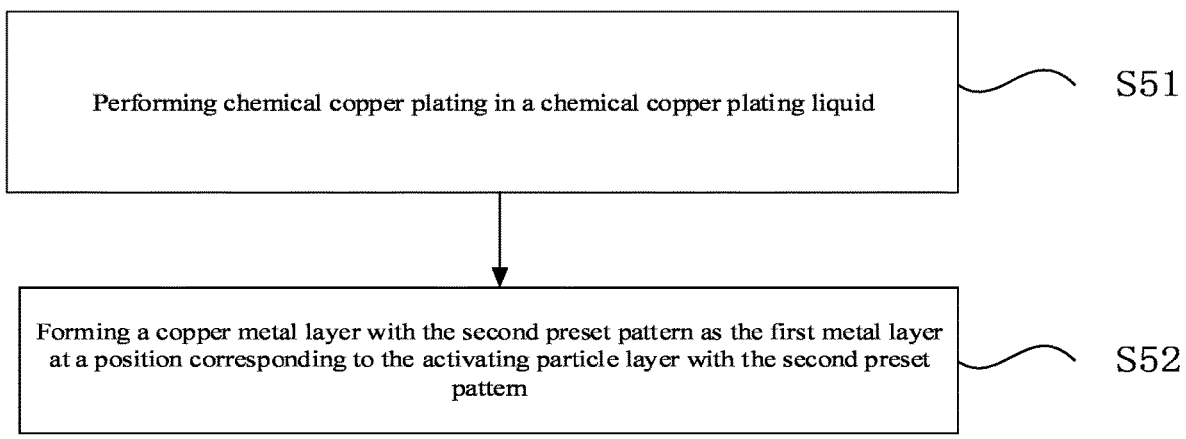
FIG. 2 is a schematic flowchart of step S5 in the flowchart of FIG. 1 of the present application.

FIG. 2 is a schematic flowchart of step S5 in the flowchart of FIG. 1 of the present application. As shown in FIG. 2, the step S5 of performing chemical copper plating to form a copper metal layer with the second preset pattern as the first metal layer at a position corresponding to the activating particle layer with the second preset pattern includes:

S51: placing the glass substrate, from which the photoresist layer with the first preset pattern and the activating particle layer with the first preset pattern are removed and which is provided with the activating particle layer with the second preset pattern, into chemical copper plating liquid for chemical copper plating; and S52: forming a copper metal layer with the second preset pattern as the first metal layer at the position corresponding to the activating particle layer with the second preset pattern;

where the chemical copper plating liquid includes a copper salt, a reducing agent, a complexing agent, an accelerator and a surfactant.

The glass substrate after the soaking activation is placed in the chemical copper plating liquid, so that the glass substrate is uniformly contacted with the chemical copper plating liquid integrally, and a copper metal layer is formed through chemical reaction. The formed copper metal layer is compact and has good adhesive force, and the copper for chemical plating is high in stability. The chemical copper plating liquid used is free of strong acid, strong base and cyanides, and does not require electrification. Therefore, it is energy-saving and environmentally friendly, and solves the problems of high pollution and high energy consumption of electroplating.

Specifically, the copper salt includes copper sulfate, copper chloride, copper acetate, copper nitrate and the like, the reducing agent includes glyoxylic acid, sodium hypophosphite, dimethyl aminobenzene and the like, the complexing agent includes Ethylene Diamine Tetraacetic Acid (EDTA), Triethanolamine (TEA), triisopropanolamine and the like, the accelerator includes pyridines, and the surfactant includes polyethylene glycol-1000, fatty acid sulfide and the like.

As for the chemical copper plating liquid used, specifically, the temperature is 50-100° C., and the chemical copper plating lasts for 0.1-10 minutes. Preparation in a low-temperature liquid phase (50-100° C.) avoids the reduction of conductivity due to poor surface flatness resulting from coarse particles on the copper metal layer and avoids the oxidization of the copper metal layer. When the temperature of the chemical copper plating is too low, namely less than 50° C., the speed of depositing copper metal is slow, and thus the compactness of the film formed on the glass substrate is poor, a continuous film cannot be formed, and the adhesive force between the copper metal layer deposited and the glass substrate is poor; while when the temperature of the chemical copper plating is higher, namely over 100° C., the speed of depositing copper metal is fast, and thus the deposited copper film is easy to bubble, and the adhesive force is also affected. A more suitable temperature range for the chemical copper plating liquid is 75-90° C. The required thickness of the film layer is usually 3000-5000 angstroms, so the suitable duration of the chemical copper plating is 0.5-3 minutes.

The step S5 of performing chemical copper plating to form a copper metal layer with the second preset pattern as the first metal layer at a position corresponding to the activating particle layer with the second preset pattern is followed, by:

placing the glass substrate provided with the copper metal layer with the second preset pattern into warm water to remove residual chemical copper plating liquid; and annealing the glass substrate from which the residual chemical copper plating liquid is removed;

where the temperature of the warm water is 40-60° C. The residual chemical copper plating liquid is removed by warm water so as to avoid affecting the subsequent manufacture procedure, and meanwhile, annealing is carried out to improve the adhesive force between the CU and the buffer layer. The temperature of the warm water is set to be between 40-60° C., thus a temperature gradient is provide. When the temperature is lower than 40° C., the adhesive force is easily influenced due to too low temperature, and when the temperature is higher than 60° C., the purpose of slow temperature reduction cannot be achieved if the temperature is too high.

Figure 3:
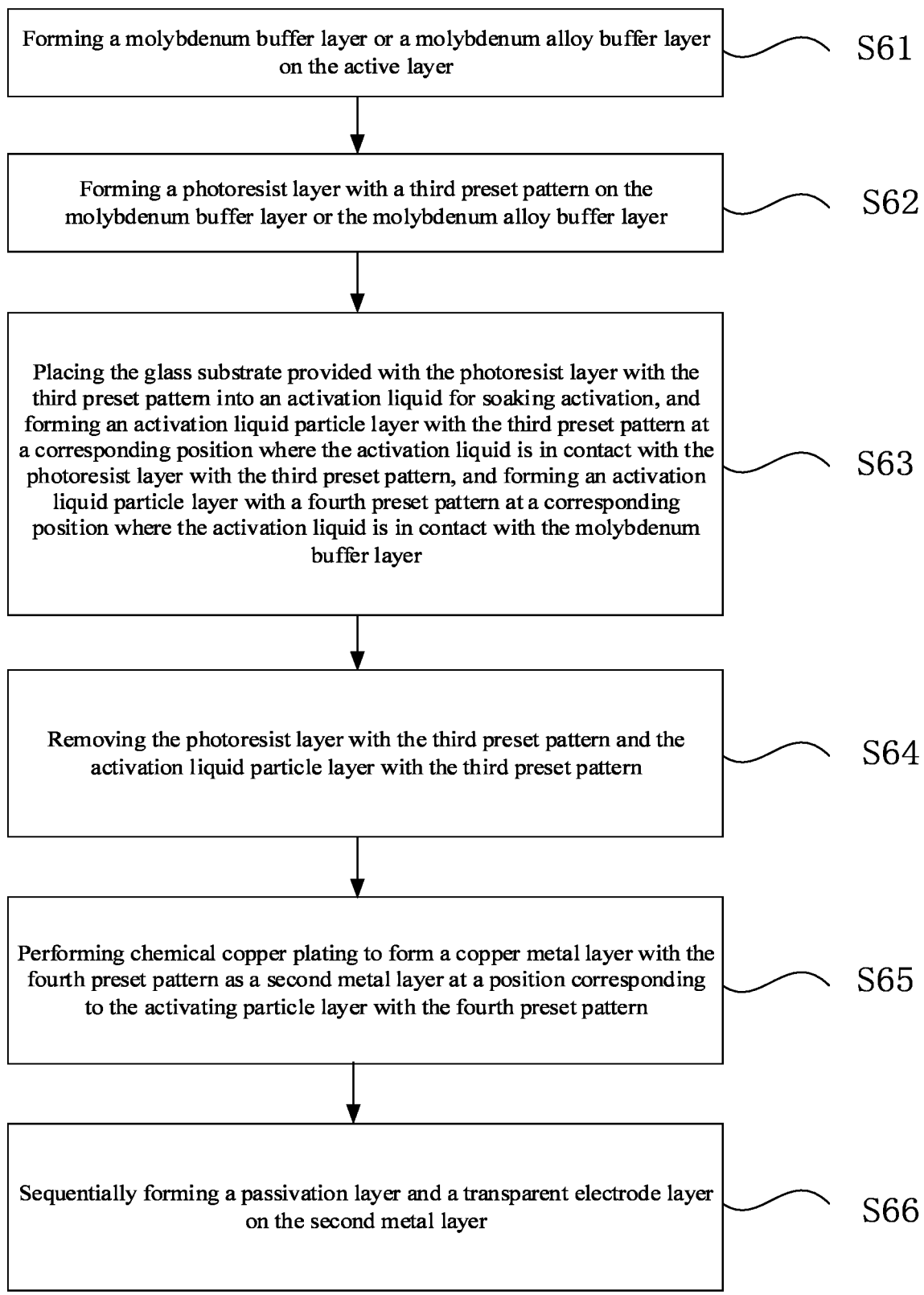
FIG. 3 is a schematic flowchart of a method for forming a second metal layer according to an embodiment of the present application.

FIG. 3 is a schematic flowchart of a method for forming a second metal layer according to an embodiment of the present application. As shown in FIG. 3 and with reference to FIG. 1, the step S6 of sequentially forming an insulating layer, an active layer, a second metal layer, a passivation layer, and a transparent electrode layer on the first metal layer includes:

S61: forming a molybdenum buffer layer or a molybdenum alloy buffer layer on the active layer;

S62: forming a photoresist layer with a third preset pattern on the molybdenum buffer layer or the molybdenum alloy buffer layer;

S63: placing the glass substrate provided with the photoresist layer with the third preset pattern into an activation liquid for soaking activation, and forming an activation liquid particle layer with the third preset pattern at a corresponding position where the activation liquid is in contact with the photoresist layer with the third preset pattern, and forming an activation liquid particle layer with a fourth preset pattern at a corresponding position where the activation liquid is in contact with the molybdenum buffer layer;

S64: removing the photoresist layer with the third preset pattern and the activation liquid particle layer with the third preset pattern;

S65: performing chemical copper plating to form a copper metal layer with the fourth preset pattern as a second metal layer at a position corresponding to the activation liquid particle layer with the fourth preset pattern; and S66: sequentially forming a passivation layer and a transparent electrode layer on the second metal layer.

In the present solution, an activating particle layer with a preset pattern is formed on the molybdenum buffer layer or the molybdenum alloy buffer layer in advance through a photoresist layer and activation, and then a copper metal layer corresponding to the pattern of the activating layer with the fourth preset pattern is formed on the activating particle layer in chemical copper plating. The chemical copper plating liquid used is free of strong acid, strong base and cyanides, involves no environment concern, and does not require electrification. Therefore, it is energy-saving and environmentally friendly, and solves the problems of high pollution and high energy consumption of electroplating. In addition, the metal for the chemical plating is copper metal, and the copper metal layer formed by chemical copper plating is compact and has excellent binding force and high stability. Forming the molybdenum buffer layer or the molybdenum alloy buffer layer on the active layer can well protect the copper metal layer. However, the molybdenum buffer layer or the molybdenum alloy buffer layer is not a necessity.

Figure 4:
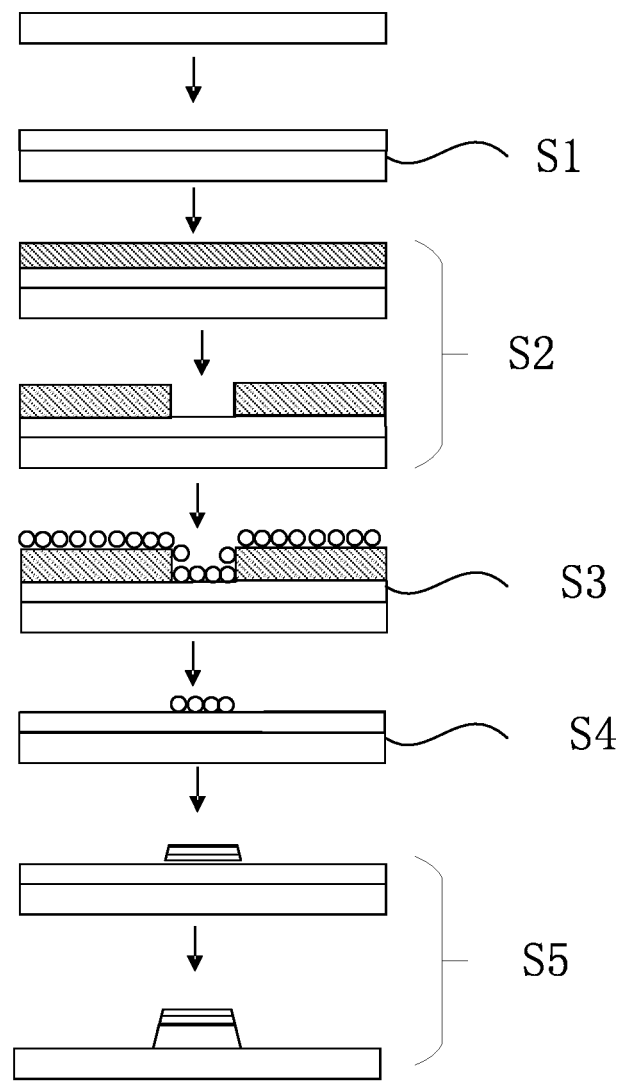
FIG. 4 is a schematic diagram of a manufacturing process for forming a first metal layer according to an embodiment of the present application.
Figure 5:
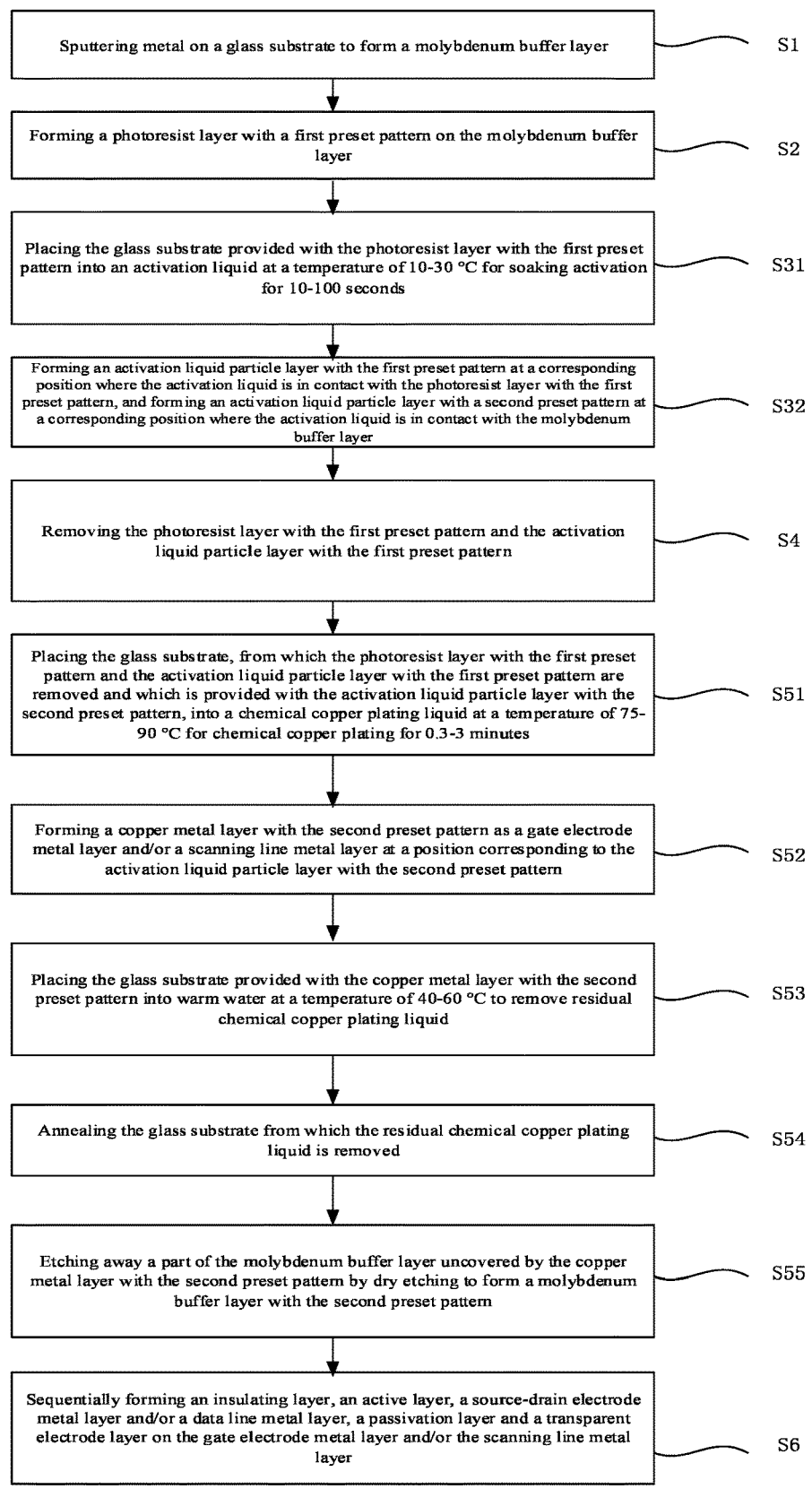
FIG. 5 is a schematic flowchart of a manufacturing method for a array substrate according to another embodiment of the present application.

FIG. 4 is a schematic diagram of a manufacturing process for forming a first metal layer according to an embodiment of the present application, and FIG. 5 is a schematic flowchart of a manufacturing method for a array substrate according to another embodiment of the present application. As shown in FIG. 4 and FIG. 5, and with reference to FIG. 1 to FIG. 3, the present application further discloses a manufacturing method for a array substrate, which includes the steps of:

S1: sputtering metal on a glass substrate to form a molybdenum buffer layer;

S2: forming a photoresist layer with a first preset pattern on the molybdenum buffer layer;

S31: placing the glass substrate provided with the photoresist layer with the first preset pattern into an activation liquid at a temperature of 10-30° C. for soaking activation for 10-100 seconds;

S32: forming an activation liquid particle layer with the first preset pattern at a corresponding position where the activation liquid is in contact with the photoresist layer with the first preset pattern, and forming an activation liquid particle layer with a second preset pattern at a corresponding position where the activation liquid is in contact with the molybdenum buffer layer;

S4: removing the photoresist layer with the first preset pattern and the activation liquid particle layer with the first preset pattern;

S51: placing the glass substrate, from which the photoresist layer with the first preset pattern and the activation liquid particle layer with the first preset pattern are removed and which is provided with the activation liquid particle layer with the second preset pattern, into chemical copper plating liquid at a temperature of 75-90 CC for chemical copper plating for 0.3-3 minutes;

S52: forming a copper metal layer with the second preset pattern as a gate electrode metal layer and/or a scanning line metal layer at a position corresponding to the activation liquid particle layer with the second preset pattern;

S53: placing the glass substrate provided with the copper metal layer with the second preset pattern into warm water at a temperature of 40-60° C. to remove residual chemical copper plating liquid;

S54: annealing the glass substrate from which the residual chemical copper plating liquid is removed;

S55: etching away a part of the molybdenum buffer layer uncovered by the copper metal layer with the second preset pattern by dry etching to form a molybdenum buffer layer with the second preset pattern; and S6: sequentially forming an insulating layer, an active layer, a source-drain electrode metal layer and/or a data line metal layer, a passivation layer and a transparent electrode layer on the gate electrode metal layer and/or the scanning line metal layer;

where the chemical copper plating liquid includes a copper salt, a reducing agent, a complexing agent, an accelerator and a surfactant. Molybdenum is sputtered on the glass substrate to form a molybdenum buffer layer, which improves the adhesive force, prevents separation, and meanwhile improves compactness and prevents undercut. An activation liquid particle layer with a preset pattern is formed on the molybdenum buffer layer in advance through a photoresist layer and activation, and then the activation liquid particle layer forms a copper layer corresponding to the pattern of the activating layer in chemical copper plating, where due to the use of the chemical copper plating, electrification is not required, and a first metal layer is formed according to the redox reaction principle, so that an etching process is not involved. The compactness is increased by the formation of a layer through chemical reaction and the combination at the atomic ion level. The chemical plating liquid used is free of strong acid, strong base and cyanides, involves no environment concern, and does not require electrification. Therefore, it is energy-saving and environmentally friendly, and solves the problems of high pollution and high energy consumption of electroplating. The copper for chemical plating is high in stability, and is applicable for a wide range of working temperatures and solution concentrations. The copper metal layer is compact and has excellent binding force. Preparation through chemical plating in a low-temperature liquid phase (50-100° C.) avoids the reduction of conductivity due to poor surface flatness resulting from coarse particles on the copper metal layer and avoids the oxidization of the copper metal layer.

The present application further discloses a array substrate, an array substrate manufactured by the manufacturing method for a array substrate described above. The array substrate includes a glass substrate, a buffer layer, a gate electrode, an insulating layer, an active layer, a source electrode, a drain electrode, a passivation layer and a transparent electrode layer, where the buffer layer is disposed on the glass substrate, the gate electrode is disposed on the buffer layer, the insulating layer covers the gate electrode, the active layer is disposed on the insulating layer, the source electrode and the drain electrode are disposed respectively on two sides of the active layer, the passivation layer and the transparent electrode layer are sequentially formed on the source electrode and the drain electrode, and the buffer layer includes a molybdenum buffer layer or a molybdenum alloy buffer layer.

Figure 6:
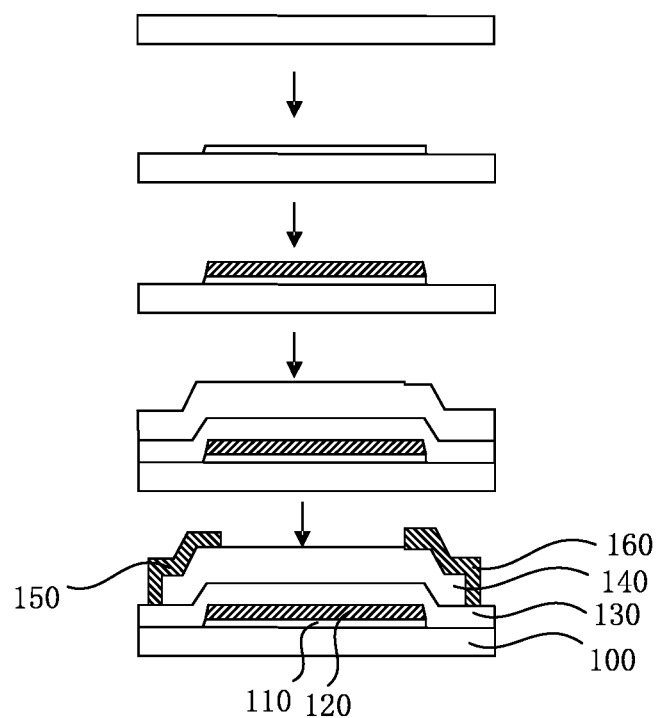
FIG. 6 is a structural schematic diagram of a display panel according to an embodiment of the present application.

FIG. 6 is a structural schematic diagram of a display panel according to an embodiment of the present application. As shown in FIG. 6, the present application further discloses a display panel, an array substrate manufactured by the manufacturing method for a display panel described above, and a color filter substrate disposed opposite to the array substrate. The array substrate includes a glass substrate 100, a buffer layer 110, a gate electrode 120, an insulating layer 130, an active layer 140, a source electrode 150, a drain electrode 160, a passivation layer and a transparent electrode layer, where the buffer layer is disposed on the glass substrate, the gate electrode is disposed on the buffer layer, the insulating layer covers the gate electrode, the active layer is disposed on the insulating layer, the source electrode and the drain electrode are disposed respectively on two sides of the active layer, the passivation layer and the transparent electrode layer are sequentially formed on the source electrode and the drain electrode, and the buffer layer includes a molybdenum buffer layer or a molybdenum alloy buffer layer.

It should be noted that, the limitation of the steps involved in this solution, without affecting the implementation of the specific solution, is not determined to limit the sequence of steps, and the previous steps may be executed first, later, or even simultaneously. Any sequence shall be deemed to fall within the scope of the present application as long as the solution can be implemented.

The technical solution of the present application can be applied to a wide variety of display panels, such as Twisted Nematic (TN) display panels, In-Plane Switching (IPS) display panels, Vertical Alignment (VA) display panels, Multi-domain Vertical Alignment (MVA) display panels, and other types of display panels, such as Organic Light-Emitting Diode (OLED) display panels.

The above content is a further detailed description of the present application in conjunction with specific optional embodiments, and it is not to be construed that specific embodiments of the present application are limited to these descriptions. For those of ordinary skill in the art to which the present application belongs, a number of simple derivations or substitutions may be made without departing from the spirit of the present application, all of which shall be deemed to fall within the scope of the present application.

What is claimed is:

1. A manufacturing method of an array substrate, comprising:

forming a buffer layer on a glass substrate;

forming a photoresist layer having a first preset pattern on the buffer layer, wherein when forming the photoresist layer having the first preset pattern on the buffer layer, the buffer layer is not etched;

placing the glass substrate comprising the photoresist layer having the first preset pattern into an activation agent for activation, and forming an activating particle layer having the first preset pattern at a corresponding position where the activation agent is in contact with the photoresist layer having the first preset pattern, and forming an activating particle layer having a second preset pattern at a corresponding position where the activation agent is in contact with the buffer layer;

removing the photoresist layer having the first preset pattern and the activating particle layer having the first preset pattern;

performing chemical plating to form a first metal layer having the second preset pattern at a position corresponding to the activating particle layer having the second preset pattern; and sequentially forming an insulating layer, an active layer, a second metal layer, a passivation layer and a transparent electrode layer on the first metal layer.

2. The manufacturing method of an array substrate according to claim 1, further comprising, after the step of performing chemical plating to form a first metal layer having the second preset pattern at a position corresponding to the activating particle layer having the second preset pattern:

etching away a part of the buffer layer uncovered by the first metal layer having the second preset pattern to form the buffer layer having the second preset pattern;

wherein the buffer layer comprises a molybdenum buffer layer or a molybdenum alloy buffer layer.

3. The manufacturing method of an array substrate according to claim 2, wherein the part of the buffer layer uncovered by the first metal layer having the second preset pattern is etched away by dry etching.

4. The manufacturing method of an array substrate according to claim 1, wherein the activation agent is an activation liquid, the activation is soaking activation, and the activating particle layer is an activation liquid particle layer.

5. The manufacturing method of an array substrate according to claim 1, wherein the step of performing chemical plating to form a first metal layer having the second preset pattern at a position corresponding to the activating particle layer having the second preset pattern comprises:

performing chemical copper plating or chemical nickel plating to form a copper metal layer or a nickel metal layer having the second preset pattern as the first metal layer at a position corresponding to the activating particle layer having the second preset pattern.

6. The manufacturing method of an array substrate according to claim 1, wherein the step of performing chemical plating to form a first metal layer having the second preset pattern at a position corresponding to the activating particle layer having the second preset pattern comprises:

performing chemical copper plating in a chemical copper plating liquid; and forming a copper metal layer having the second preset pattern as the first metal layer at a position corresponding to the activating particle layer having the second preset pattern;

wherein the chemical copper plating liquid comprises a copper salt, a reducing agent, a complexing agent, an accelerator and a surfactant.

7. The manufacturing method of an array substrate according to claim 6, wherein a temperature of the chemical copper plating liquid is 50-100° C., and a duration of the chemical copper plating is 0.1-10 minutes.

8. The manufacturing method of an array substrate according to claim 6, further comprising, after the step of performing chemical copper plating to form a copper metal layer having the second preset pattern as the first metal layer at a position corresponding to the activating particle layer having the second preset pattern:

placing the glass substrate provided with the copper metal layer having the second preset pattern into warm water to remove residual chemical copper plating liquid; and annealing the glass substrate from which the residual chemical copper plating liquid is removed;

wherein a temperature of the warm water is 40-60° C.

9. The manufacturing method of an array substrate according to claim 6, wherein the copper salt comprises copper sulfate, copper chloride, copper acetate, or copper nitrate.

10. The manufacturing method of an array substrate according to claim 6, wherein the reducing agent comprises glyoxylic acid, sodium hypophosphite, or dimethyl aminobenzene.

11. The manufacturing method of an array substrate according to claim 6, wherein the complexing agent comprises ethylenediaminetetraacetic acid, triethanolamine, or triisopropanolamine.

12. The manufacturing method of an array substrate according to claim 6, wherein the accelerator comprises pyridines.

13. The manufacturing method of an array substrate according to claim 6, wherein the surfactant comprises polyethylene glycol-1000 or fatty acid sulfide.

14. The manufacturing method of an array substrate according to claim 1, wherein the step of sequentially forming an insulating layer, an active layer, a second metal layer, a passivation layer and a transparent electrode layer on the first metal layer comprises:

forming a molybdenum buffer layer or a molybdenum alloy buffer layer on the active layer;

forming a photoresist layer having a third preset pattern on the molybdenum buffer layer or the molybdenum alloy buffer layer;

placing the glass substrate provided with the photoresist layer having the third preset pattern into an activation liquid for soaking activation, and forming an activation liquid particle layer having the third preset pattern at a corresponding position where the activation liquid is in contact with the photoresist layer having the third preset pattern, and forming an activation liquid particle layer having a fourth preset pattern at a corresponding position where the activation liquid is in contact with the molybdenum buffer layer;

removing the photoresist layer having the third preset pattern and the activation liquid particle layer having the third preset pattern;

performing chemical copper plating to form a copper metal layer having the fourth preset pattern as a second metal layer at a position corresponding to the activation liquid particle layer having the fourth preset pattern; and sequentially forming a passivation layer and a transparent electrode layer on the second metal layer.

15. The manufacturing method of an array substrate according to claim 1, wherein a Thin Film Transistor (TFT) formed on the array substrate is of a bottom-gate structure, and wherein the first metal layer comprises a gate electrode and a scan line formed in a same layer by chemical plating.

16. The manufacturing method of an array substrate according to claim 1, wherein the buffer layer is made of a transparent and non-conductive material, and wherein the buffer layer is not etched in the array substrate that is finally made.

17. The manufacturing method of an array substrate according to claim 16, wherein the buffer layer is a color resist layer.

18. The manufacturing method of an array substrate according to claim 1, wherein the activation agent and the activating particle layer comprise HCl (hydrogen chloride), SnCl2 (stannous chloride), and PdCl2 (palladium chloride); or HCl (hydrogen chloride), NaCl (sodium chloride), SnCl2 (stannous chloride), and PdCl2 (palladium chloride); or HCl (hydrogen chloride), KCl (potassium chloride), SnCl2 (stannous chloride), and PdCl2 (palladium chloride).

* * * * *